United States Patent [19]

Blaney

[11] Patent Number: 5,608,606
[45] Date of Patent: Mar. 4, 1997

[54] COMPUTER PLUG-IN MODULE AND INTERCONNECTION SYSTEM FOR WIRELESS APPLICATIONS

[75] Inventor: Timothy J. Blaney, Fremont, Calif.

[73] Assignee: Apple Computer, Inc., Cupertino, Calif.

[21] Appl. No.: 259,435

[22] Filed: Jun. 14, 1994

[51] Int. Cl.$^6$ .................. G06F 1/16; H05K 7/10
[52] U.S. Cl. .................. 361/686; 439/64; 439/541.5; 439/946; 361/737
[58] Field of Search .................. 439/63, 64, 76.1, 439/377, 540.1, 541.5, 680, 946; 364/708.1; 361/684, 686, 737, 785, 796, 797, 802

[56] References Cited

U.S. PATENT DOCUMENTS

| | | | |
|---|---|---|---|
| 4,545,023 | 10/1985 | Mizzi | 361/680 X |
| 4,894,792 | 1/1990 | Mitchell et al. | 361/684 |
| 5,103,378 | 4/1992 | Stowers et al. | 361/802 |
| 5,139,439 | 8/1992 | Shie . | |
| 5,190,461 | 3/1993 | Oorui et al. | 439/63 |
| 5,299,089 | 3/1994 | Lwee | 439/541.5 X |
| 5,375,037 | 12/1994 | Le Roux | 361/684 |
| 5,440,449 | 8/1995 | Scheer . | |

FOREIGN PATENT DOCUMENTS

| | | |
|---|---|---|
| 6178218 | 6/1994 | Japan . |
| 2243034 | 10/1991 | United Kingdom . |
| 9409461 | 4/1994 | WIPO . |

*Primary Examiner*—Michael W. Phillips
*Attorney, Agent, or Firm*—Daniel P. Hopen; Greg T. Sueoka; Mark C. Terrano

[57] ABSTRACT

A computing system comprises a connection system for coupling wireless technologies to a computer. The connection system comprises a card connector and a matting internal connector cage/frame. The card connector provides an RF connector positioned above a 68 pin connector, which provides a connection to radio frequency (RF) signals. A card has devices which support RF operations for the computing system. The card connector is attached to the card and interfaces with the devices on the card. The housing of the computing system defines a card slot which receives the card and guides connection of the card with the computing system by mating the card connector with the internal connector.

15 Claims, 8 Drawing Sheets

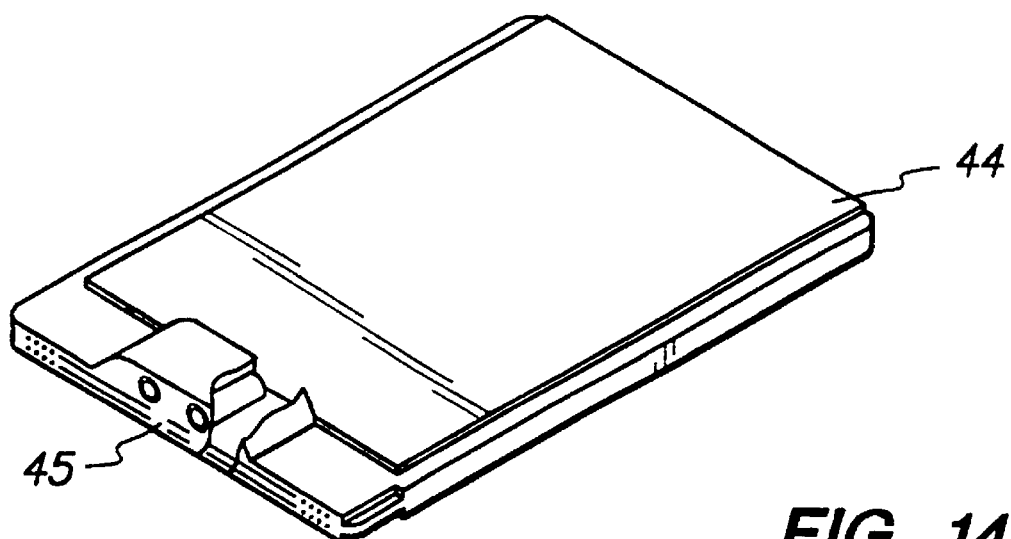
FIG. 14
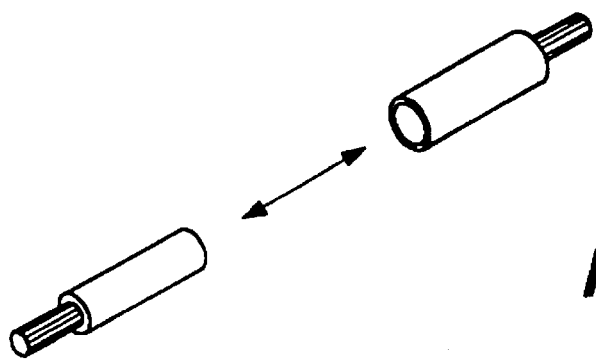
FIG. 15B
FIG. 15A

COMPUTER PLUG-IN MODULE AND INTERCONNECTION SYSTEM FOR WIRELESS APPLICATIONS

BACKGROUND OF THE INVENTION

1. Field of the Invention

This invention relates to computers that accept external plug-in modules to provide additional functionality such as more memory, additional disk space, a networking capability or a wireless communication capability. In particular, the present invention relates to a plug-in module having a connector adapted for connection to a wireless communication system and a connector adapted to mate with the plug-in module as well as conventional plug-in modules.

2. Description of the Related Art

Modern technological advancements have increased the number of features available to a portable computer. Features include facsimile (fax) modems, additional communication interfaces, extra random access memories (RAM), or flash memories, and additional hard disk drives. These additional features if all incorporated into the portable computer will substantially increase the weight and size of the portable computer reducing the portability of the computer. Besides, any one user is not likely to need all the available features or be willing to pay the increased costs associated with having all the additional features.

A standard interface has been developed that allows computer designers and manufacturers to build modules that can be plugged into the standard interface. An application-specific module called a Personal Computer Memory Card International Association (PCMCIA) card can be removed and substituted for other PCMCIA cards depending on the configuration and functionality desired by the user. Thus, users are able to customize their portable computers to their particular needs at any given instant.

FIG. 1 shows a computer system 10 having a PCMCIA slot 12 for receiving a PCMCIA card 14. The computer system 10 can be a portable computer. The portable Computer 10 has a hinged display which permits the display to fold closed against the keyboard. The keyboard has keys that are arranged and large enough to enable an average person to type and input data comfortably. With the display facing the front side, the left side of the portable computer 10 defines a PCMCIA slot 12 for receiving and interfacing with PCMCIA cards. The PCMCIA card outline and shape are specified so that designers and manufacturers can provide cards that can be interchangably inserted into the PCMCIA slot. A user can slide the PCMCIA card 14 into the PCMCIA slot 12 leading to a keyed 68 pin connect&. The keyed 68 pin connector ensures proper mating between the PCMCIA card 14 and the PCMCIA interface of the portable computer.

The PCMCIA specification also specifies hot insertion and removal of any PCMCIA card. In other words, the portable computer does not have to be powered down before the user can swap PCMCIA cards. When the user is finished with a PCMCIA card, the PCMCIA card is simply removed and replaced with another PCMCIA card without having to power down the computer. Hot insertion and removal of PCMCIA cards provide ease of use and considerable time and power savings by not having to power down the computer. Power is saved by not having to use the disk drive to reload the data back into the memory of the portable computer. Some of the functions that are available from PCMCIA cards include high speed fax or data modems, Ethernet interfaces, additional RAM, flash memories, additional hard disk drives, multimedia applications, and wireless operations.

The prior art includes three types of PCMCIA cards: a Type I card, a Type II card, and a Type III card. FIG. 2A shows a Type I PCMCIA card 25. The length of the Type I card 25 is approximately 85.6 mm, the width is approximately 54.0 mm, and the height is approximately 3.3 mm. The connector area 27 of Type I card 25 includes a dual row 68 pin in-line connector. The dual row 68 pin in-line connector is keyed to aid proper connection to a PCMCIA mating connector within a computer system 10 such as the portable computer shown in FIG. 1.

FIG. 2B shows a Type II card 30. Type II cards are essentially the same as Type I cards except that the Type II cards are allowed to have raised sections which increase the thickness of the Type II card over the Type I card. A raised section 32 is shown on the top side of Type II card 30. A similar raised section corresponding to raised section 32 is on the bottom side of the Type II card 30. In adopting Type II cards 30, the distance from the center line of the 68 pin connector to either the top side of the card or to the bottom side of the card of connector area 34 is limited to a maximum of 2.5 mm which includes the raised sections of the Type II card. The raised sections permit designers and manufacturers to incorporate more circuitry and devices into the PCMCIA cards.

The prior art also includes Type I and Type II Extended PCMCIA cards. The Type I Extended and Type II Extended cards are the same as the Type I and Type II cards except for an extended portion. The extended portion extends 10 mm past the standard card length of 85.6 mm before the height can be increased to a bubble area. The bubble area provides additional space for extra circuitry that is included in the Type I and Type II Extended PCMCIA cards. The lower substrate of the extended bubble area measured from the centerline of the 68 pin connector to the bottom of the card is the same thickness for the entire length. In other words, the Type I Extended card and Type II Extended card retain the 2.5 mm distance from the centerline of the 68 pin connector to the bottom side of the card. The extended bubble area measured from the centerline of the 68 pin connector to the top of the bubble is approximately 8.0 mm. The thicker bubble area of the Type I Extended card and Type II Extended card permits designers and manufacturers to incorporate the thicker conventional RJ-11 and RJ-45 standard connectors.

FIG. 2C shows a Type III card 36. Connector area 34 of Type III card 36 includes a dual row 68 pin in-line connector that is keyed to aid insertions. The Type III PCMCIA card is thicker so that additional devices can be accommodated. Type III cards are often found to include small form factor hard drives. Type III cards have the same outline as Type II cards except that the Type III cards are twice the thickness. However, the centerline of the 68 pin connector of the Type III card to the bottom of the card maintains the PCMCIA standard of approximately 2.5 mm. The centerline of the 68 pin connector of the Type III card to the top of the card is approximately 8.0 mm.

One of the newest technologies to utilize the PCMCIA interface of portable computers is wireless technology. A wireless PCMCIA link provides portable computer users with the ability to send and receive data and fax transmissions using cellular technology. A major problem associated with designing radio communication solutions for portable computers is coupling the intended data/signal to the wireless medium and retrieving that same data/signal from the wireless medium at the other end. Antennae are used to send and retrieve data from wireless mediums. Thus, in order for a portable computer to access a wireless medium, the portable computer has to have an interface capable of coupling to an antenna for transmitting and receiving wireless transmissions.

FIG. 3 shows an example of a wireless PCMCIA link utilizing cellular technology for fax/data transmissions. A portable computer 50 is coupled to a cellular phone 55 to obtain access to wireless service via a PCMCIA Type II card 58. A PCMCIA Type II card 58 provides an interface between the portable computer 50 and the cellular phone 55. The PCMCIA Type II card 58 is coupled to a connecting cable 52 which is coupled to a phone cradle 54. The phone cradle 54 provides a connection to the cellular phone 55. The cellular phone 55 provides the external antenna and the necessary circuitry to establish a wireless link to the cellular technology. The PCMCIA Type II card 58 includes circuitry to permit the portable computer 50 to exchange data with the cellular phone 55. However, the additional cabling 52 and connectors introduce associated problems that often lead to loose, misaligned, or open connections. The additional cabling 52 attached to the PCMCIA Type II card 58 is prone to being sheared or broken with use. Moreover, the external components, the connecting cable 52, the phone cradle 54 and the cellular phone 55 take away from the portability of the computer. The existing PCMCIA interface does not provide an internal antenna interface. Therefore, it is desirable to design an improved way to implement an interface that provides users of portable computers access to wireless technology which improves and overcomes the disadvantages of the prior art. The improved interface should be low cost, blind mateable, capable of repeated insertions, utilize the existing PCMCIA standard interface, and be capable of operating over a wide range of frequencies.

SUMMARY OF THE INVENTION

The present invention is an interconnection system between a computing system and plug-in cards or modules. The interconnection system comprises an internal connector housed in the computing system and a card connector housed on the external plug-in card. The internal connector provides a connection for digital signals and radio frequency (RF) signals. The card connector provides similar connections for mating with the internal connector.

The computing system preferably has a housing that defines one or more slots each which receives the card and guides connection of the card with the computing system by mating the card connector with the internal connector. The card connector and the internal connector are keyed to provide a blind mateable connection. Users simply slide the card into the card slot and guides within the slot ensure proper mating of the card connector and the internal connector for transmitting and receiving both RF and digital signals. The interconnection system of the present invention advantageously provides users the benefits of a compact, simple, and reliable interface for accessing wireless technology.

The internal connector includes a coaxial connector, a first digital connector, and a second digital connector. The coaxial connector is for receiving and transmitting of RF signals and is operative to frequencies up to 6.0 GHz. The first digital connector and the second digital connector are connectors having an equal number of pins. The coaxial connector is disposed between the first digital connector and the second connector so that the coaxial connector can receive conventional cards which do not utilize the coaxial connector. The coaxial connector does not interfere with the operation of conventional cards. If a user does not require an interface to RF signals, a conventional PCMCIA card which supports digital operations can be connected to the computing system. Thus, two cards which support digital operations can be connected to the internal connector of the computing system. The coaxial connector includes a first coaxial connector and a second coaxial connector for antennae signals to and from the computing system. The coaxial connector provides an interface to the computing system to access wireless systems.

The plug-in card of the present invention includes a digital connector and an RF connector. The digital connector of the card is attached to a first end of the card to provide a connection for digital signals, and the radio frequency (RF) connector of the card is attached to the card on the same first end above the digital connector to provide a connection for wireless communication signals. The RF connector is disposed just above the first digital connector of the card so that it does not interfere with operation of a second type II card when both are attached to the internal connector. The first digital connector is 68 pin connectors. The RF connector is a coaxial connector having a first coaxial connector and a second coaxial connector. The first coaxial connector and the second coaxial connector are used to couple a first antenna and a second antenna so that wireless operation of the computing device can be supported. Thus, the card supporting RF operations and the second card supporting digital operations can be simultaneously connected to the computing system. All three connectors, the coaxial connector, the first digital connector, and the second digital connector of the internal connector are connected to the cards. The portability value of portable computers is greatly enhanced by the integration of an entire radio transceiver device and coupling for an antenna within a single Type II card. Wireless communications like paging, cellular voice/data or wireless local area networks (LAN)/wide area networks (WAN) can be supported by embedding the necessary transceiver components in a single Type II card that utilizes the RF connector to couple with an antenna.

Other aspects and advantages of the present invention can be seen upon review of the Figures, the Detailed Description and the Claims which follow.

BRIEF DESCRIPTION OF THE DRAWINGS

FIG. 14 is a perspective view of the module of FIG. 5, partially shown in cross-section; and FIG. 15A and 15B are a perspective view of an exemplary embodiment for the male and mating female coaxial connectors used in the internal connector and card connector, respectively.

DETAILED DESCRIPTION OF THE PREFERRED EMBODIMENTS

Figure 1:
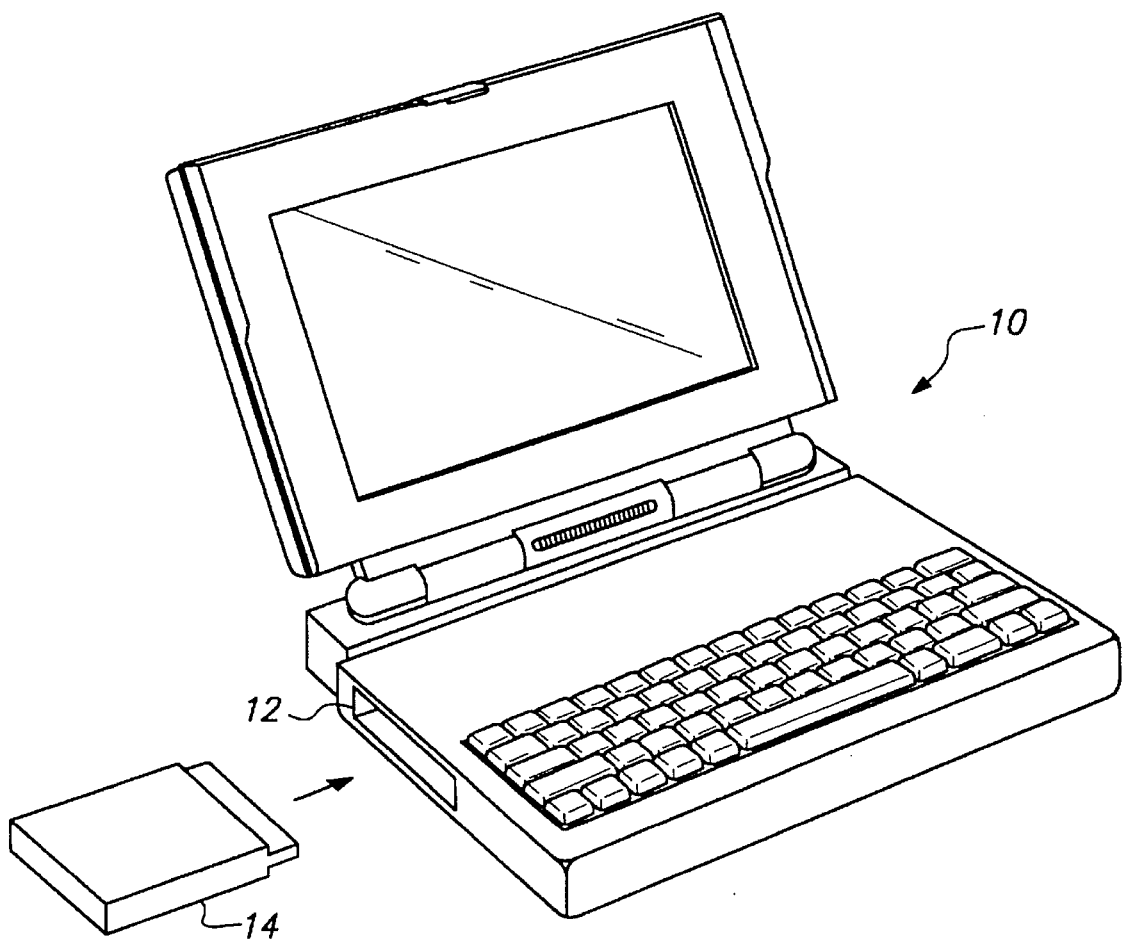
FIG. 1 depicts an example of a personal portable computer that has a plug-in card or module interface.
Figure 2A:
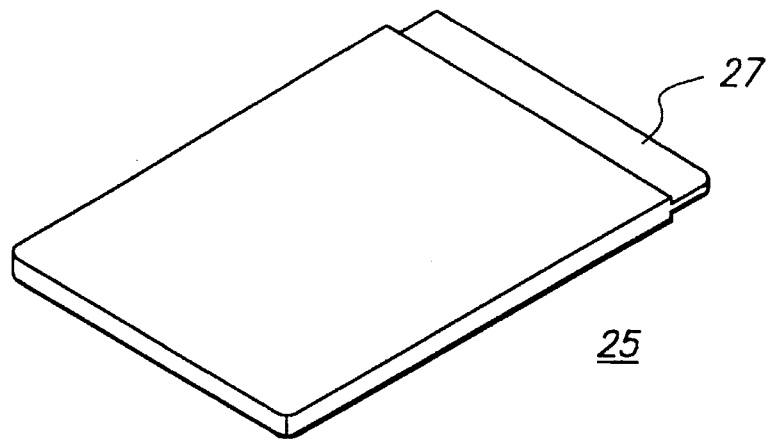
FIG. 2A depicts an example of a prior art PCMCIA Type I card that plugs into a module interface.
Figure 2B:
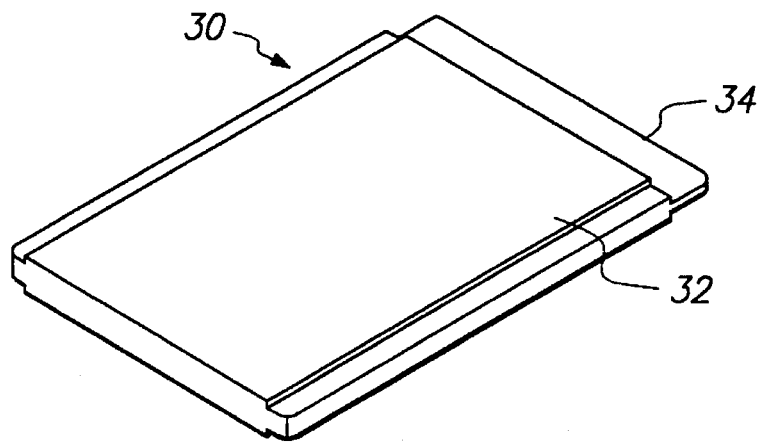
FIG. 2B depicts an example of a prior art PCMCIA Type II card that plugs into a module interface.
Figure 2C:
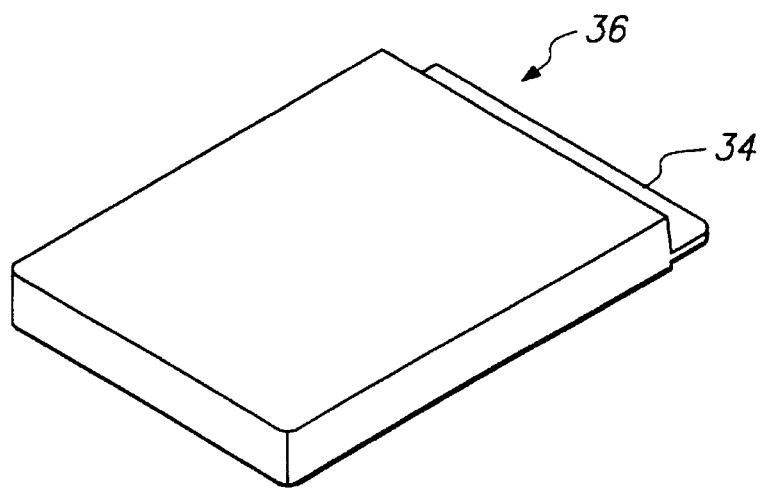
FIG. 2C depicts an example of a prior art PCMCIA Type III card that plugs into a module interface.
Figure 3:
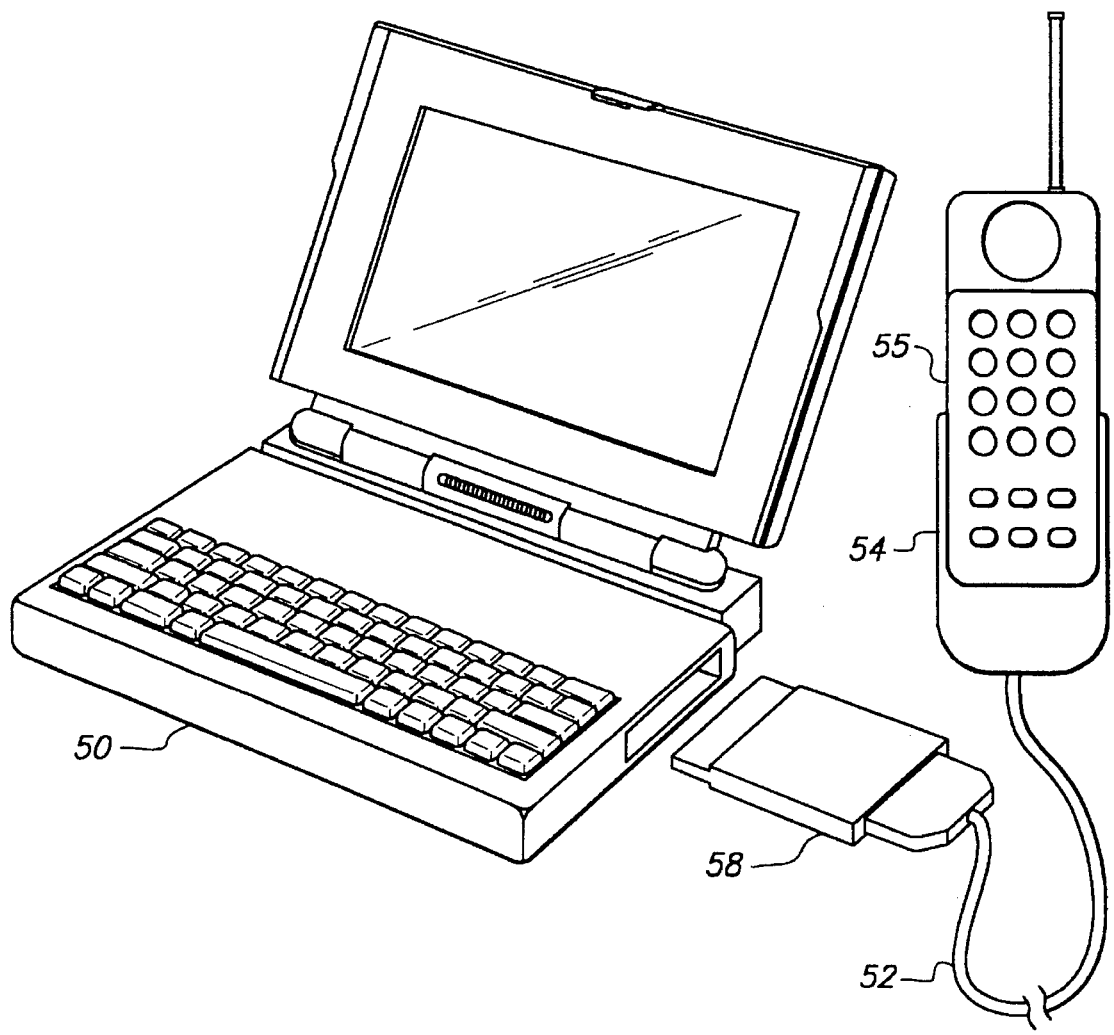
FIG. 3 depicts an example of a prior art personal portable computer having an interface to access wireless technologies.
Figure 4:
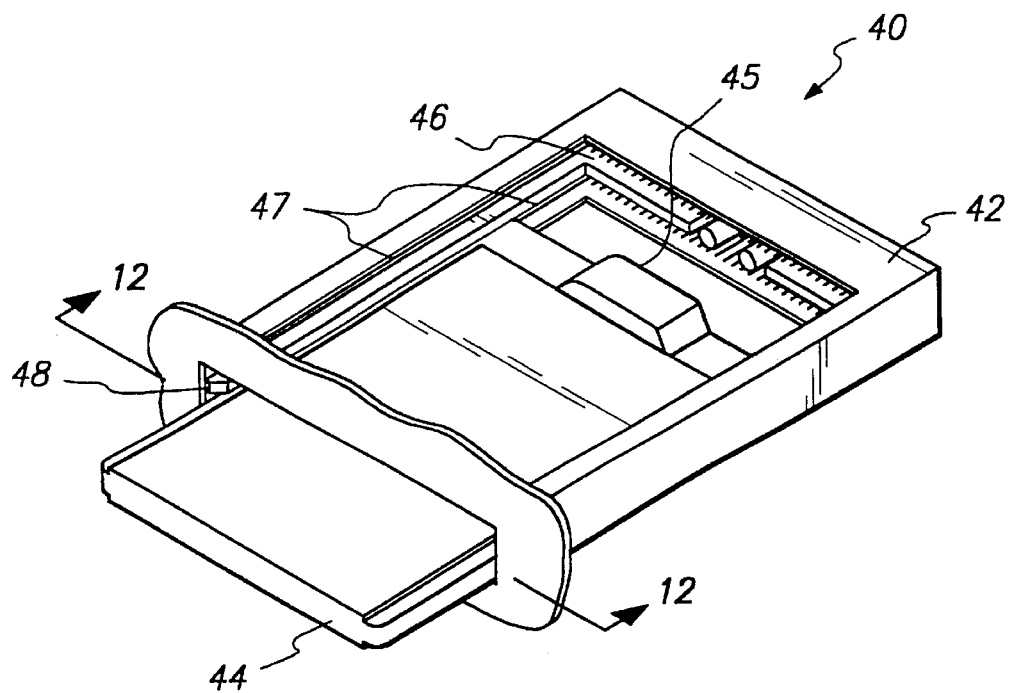
FIG. 4 depicts a card cage assembly and a first embodiment of the plug-in card of the present invention.

Referring to FIG. 4, an embodiment of an interconnection system 40 constructed according to the present invention is shown. The interconnection system 40 preferably comprises a card cage assembly 42 and a card 44 is shown. The card cage assembly 42 provides an interface to a computer system 10 such as the one shown in FIG. 1. The card cage 42 preferably has a pair of side walls, a rear wall and is attached within the computer system 10 to define a slot, preferably a Personal Computer Memory Card International Association (PCMCIA) slot. The card cage assembly 42 has an internal or cage connector 46 affixed to the rear wall of the card cage assembly 42. The card 44 has a corresponding and mating card connector 45 for connecting to cage connector 46 of the card cage assembly 42. The connector 46 preferably extends through the rear wall of the card cage 42 to facilitate the electrical coupling of modules or cards 44 to the bus (not shown) or other components internal to the chassis of the computer via the connector. The sides of the card cage 42 provide a guide 48 that defines a plurality of slots 47 for receiving cards. Each side of the cage assembly 42 preferably defines two slots 47, thereby, providing for the insertion of two cards simultaneously. The guides 48 on the opposite interior side walls of the cage assembly 42 define corresponding slots 47 on each interior side of the cage assembly 42 for receiving a card 44. Thus, card 44 is blind mateable to the internal connector 46. The card cage assembly 42 is sized to accommodate two PCMCLA Type II cards.

Figure 12:
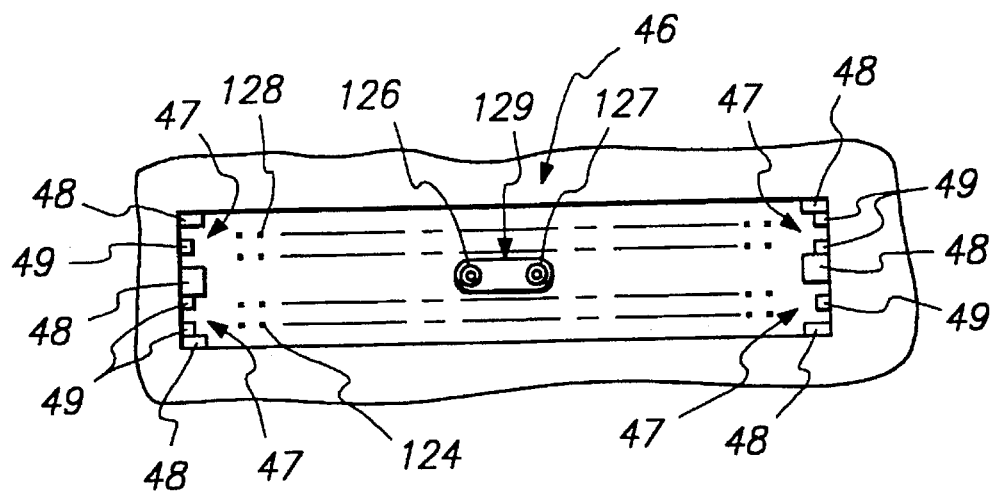
FIG. 12 shows an end view of the card cage of the present invention viewed through the aperture which the card cage defines.

In an exemplary embodiment, the card cage assembly 42 is a modified two slot PCMCIA Type II interface that incorporates the cage connector 46 for receiving the card 44 having the card connector 45. Moreover, as shown by the end view of the aperture defined by the cage assembly 42 in FIG. 12, the ends of the slots 47 proximate the connector 46 are keyed. In other words, the slots 47 have additional guides 48 to ensure that any modules or cards that are inserted into the slots 47 will only be coupled with the connector 46 if the cards 44 have the proper orientation. This prevents misalignment and possible damage to the connector 46 and the card connector 45. As is also shown in FIG. 12, the internal connector 46 comprises a first digital connector 124, a second digital connector 128, and a coaxial connector 129. The coaxial connector 129 further comprises a first coaxial connector 126 and a second coaxial connector 127. The first and second digital connectors 124 and 128 are 68 pin in-line connectors positioned in parallel orientations with the second connector 124 above the first connector 128. The coaxial connector 129 is preferably a pair of conventional coaxial connectors sized to fit within the space constraints between the first digital connector 124 and the second digital connector 128. The two coaxial connectors 126 and 127 are spaced apart on opposite sides of a centerline between the first and second digital connectors 128, and 124. All the connectors 124, 128, and 129 are preferably male type connectors.

Figure 5:
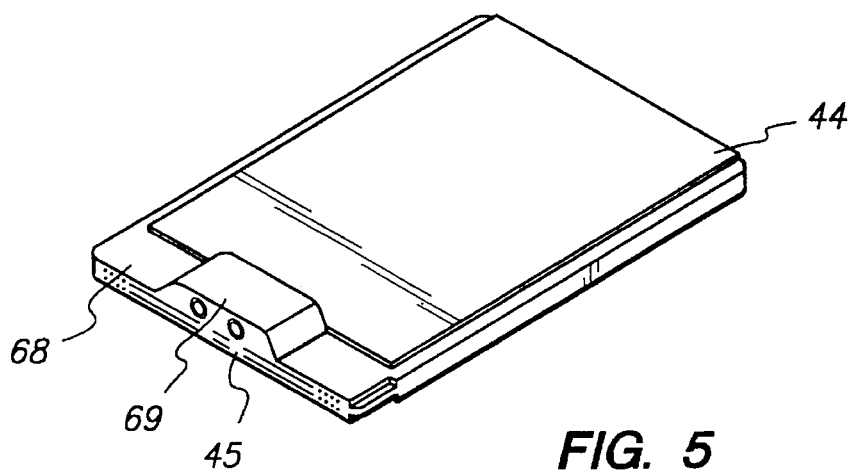
FIG. 5 depicts a perspective end view of the first embodiment of the plug-in connector assembly according to the present invention.
Figure 13:
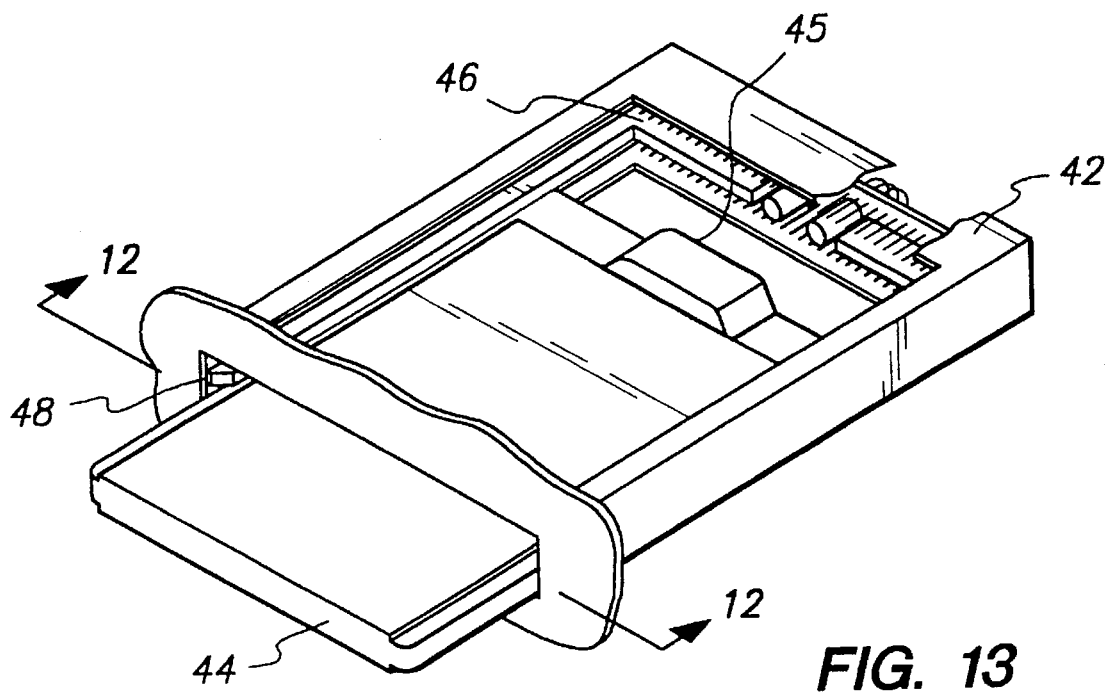
FIG. 13 is a perspective view of the card cage of FIG. 4, partially shown in cross-section.

Referring now to FIG. 5, a preferred embodiment for card 44 is shown. As has been noted above, the card 44 provides the card connector 45 to couple the circuitry in the card 44 to the computer system. The card connector 45 is preferably attached to the card at one end. The card has a generally rectangular shape with sides that are shaped to fit in the slots 47 of cage assembly 42. Proximate the end of the card 44 where the connector 45 is attached, the housing of the card forms an upward protrusion for accommodating the connector 45. As shown in FIG. 13, the internal connector 46 has an end that is positioned with the aperture defined by the cage assembly 42 and another end extending beyond the rear wall of the cage 42. This other end provides for coupling to the bus of the computer. Those skilled in the art will realize that the connector 46 is a plurality of pins and a coaxial cylinders that extend through the rear wall as shown in FIG. 13.

Similarly, as shown in FIG. 14, the card connector 45 is formed of pins and coaxial cylinders that extend through the housing forming the card 44. One end is exposed as shown in FIG. 14. The connector 45 extends into the card and the other end provides for coupling to the circuitry held in the card 44 as shown by the cross-sectional view of FIG. 14. The other end of the connector 45 is interior to the card 44 and isolated from contact except for coupling to the card circuitry. Exemplary connectors for use in the card 44 and the cage are shown in FIGS. 15A and 15B. In the exemplary embodiment, the female connector of FIG. 15B is used in the card 44 and the male coaxial connector of FIG. 15A is used in the cage 42.

Figure 6:
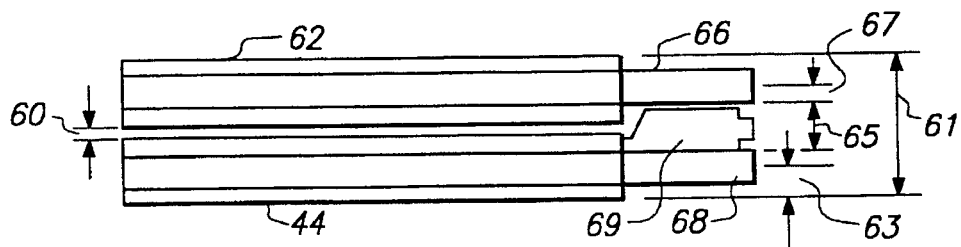
FIG. 6 depicts a side view of a Type II card and the first embodiment of the card of the present invention showing the spatial relationship between the cards when positioned in the card cage assembly of the present invention.

Referring to FIG. 6, a conventional Type II card 62 and card 44 are shown representing the spatial relationships between the cards 62, and 44 when coupled to the internal connector 46 and positioned in card cage assembly 42. Type II card 62 is stacked above card 44. Connector area 66 of Type II card 62 and connector area 68 of card 44 each include a dual row 68 pin in-line connector for interfacing to a computer system such as the one shown in FIG. 1. A dual row 68 pin in-line connector provides a digital signal interface to the computer system 10. Card 62 includes circuitry that support digital operations for a host computer system. Card 44 also provides an interface for accessing wireless technology. Exemplary dimension for the connector areas are as follows. Thickness 60 is 0.5 mm, the clearance between stacked Type II card 62 and card 44. Thickness 61 is 10.5 mm which represents the total thickness of Type II card 62 and card 44. Thickness 63 of card 44 is 2.5 mm measured from the centerline of connector area 68 to the bottom of card 44 in the substrate area. Thickness 67 of Type II card 62 is 1.65 mm measured from the centerline of connector area 66 to the bottom of the connector area 66. Thickness 65 is 2.2 mm which represents the space between connector area 66 of Type II card 62 and connector area 68 of card 44. A coaxial connector assembly 69 is positioned within the space of thickness 65. The coaxial connector assembly 69 provides a coaxial connector interface to the host computer system or its components.

Figure 7:
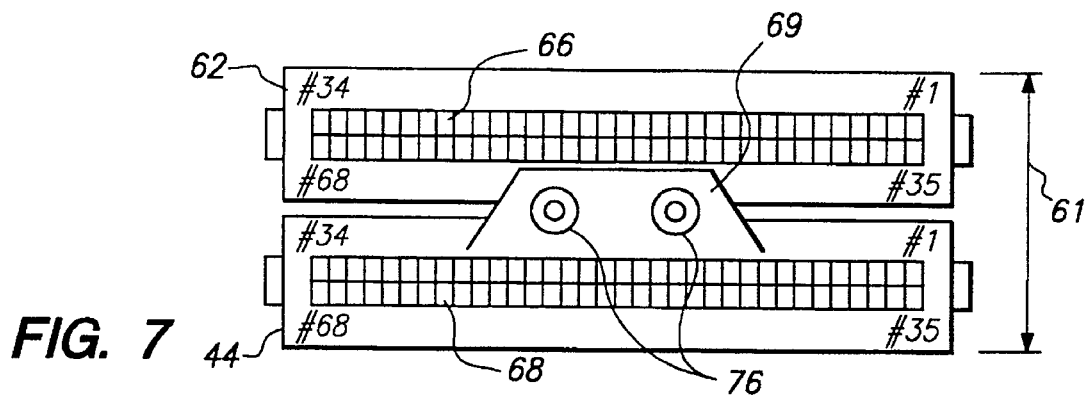
FIG. 7 depicts an end view of the Type II card and the first embodiment of the card of the present invention showing the spatial relationship between the cards when positioned in the card cage assembly of the present invention.

FIG. 7 is an end view of the Card 62 and 44 with their spatial positioning in the cage 42 retained. FIG. 7 shows one embodiment for the coaxial connector assembly 69 of the present invention. PCMCIA Type II card 62 is stacked above card 44. Connector area 66 of PCMCIA Type II card 62 and connector area 68 of card 44 each include a dual row 68 pin in-line connector. Coaxial connector assembly 69 of card 44 further includes a pair of coaxial connectors 76. The coaxial connectors 76 are positioned longitudinally in the coaxial connector assembly 69. The coaxial connectors 76 provide an interface for transceiving wireless communication signals. The wireless communication signals may be radio frequency (RF) signals. Coaxial connectors 76 are positioned within space 65 which is the clearance between connector area 66 of Type II card 62 and connector area 68 of card 44. The overall thickness 61 of Type II card 62 and card 44 is maintained at 10.5 mm. Given the small size of the coaxial connectors 76, the upper frequency bandwidth for RF signals of the coaxial connectors 76 approaches 6.0 GHz. The entire coaxial connector assembly 69 including the coaxial connectors 76 can be integrated with the connector area 66 as a unit. The coaxial connectors 76 can also transfer audio signals or video signals. For example, audio or video signals external to the computer system 10 can be transferred to the computer system 10 for output or for processing. The coaxial connectors 76 can also be designed to permit the transfer of fiber optic signals.

The coaxial connector assembly 69 of card 44 is particularly advantageous because it does not interfere with connector area 66 of PCMCIA Type II card 62. PCMCIA Type II card 62 and card 44 can both utilize the two slot card cage assembly 42 of FIG. 4. Upon removal of the cards 62 and 44, PCMCIA Type II card 62 is removed first so that the coaxial connector assembly 69 of card 44 is not obstructed by the substrate of the PCMCIA Type II card 62. Given that the coaxial connector assembly 69 is positioned in the clearance space between connector area 66 and connector area 68, the mating cage connector 46 for coaxial connector assembly 69 does not interfere with connection of two conventional PCMCIA Type II cards. Thus, a computer system 10 that incorporates the two slot card cage assembly 42 for accepting a card 44 can also accept two PCMCIA Type II cards 62. Whenever two PCMCIA Type II cards use card cage assembly 42 of FIG. 4, the cage connector 46 portion mating with the coaxial connector assembly 69 is not used and does not interfere with the mating of the PCMCIA Type II cards 62. However, if a card 44 incorporating the coaxial connector assembly 69 is present, then the card cage assembly 42 accommodates the coaxial connectors 76.

Figure 8:
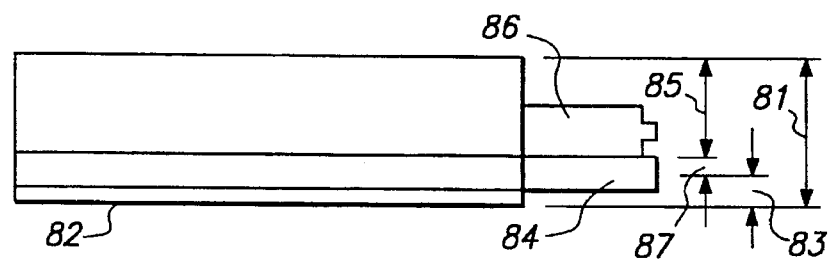
FIG. 8 depicts a side view of a second embodiment of the plug-in card according to the present invention.

Referring to FIG. 8, a second embodiment of the present invention used with a card 82 is shown. Card 82 is similar to a PCMCIA Type III card. The card 82 includes a connector area 84 having a single dual row 68 pin in line connector for interfacing to a computer system 10 and a coaxial connector assembly 86 for providing a coaxial interface. Signals that can be transferred with the coaxial interface include transceiving of wireless communication, audio signals, video signals, and fiber optic signals. Thickness 87 is 1.65 mm measured from the centerline of the connector area 84 to the outline of connector area 84, and thickness 85 is 6.35 mm measured from the outline of connector area 84 to the upper substrate of card 82. The combined thickness of thickness 87 and thickness 85 is 8.0 mm. Thickness 83 is 2.5 mm measured from the centerline of connector area 84 to the bottom substrate of card 82. Thus, card 82 is compatible with the PCMCIA Type III standard. Moreover, card 82 can also be used with the card cage 42 of FIG. 4. However, when card 82 is used the top slot 47 of the cage 42 is not otherwise usable.

Figure 9:
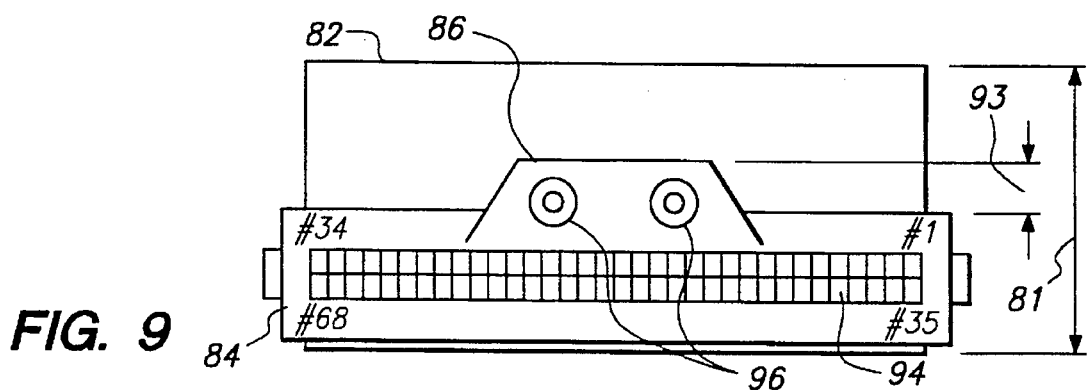
FIG. 9 depicts an end view of the second embodiment of the card of FIG. 8 showing the positioning of the connectors.

FIG. 9 is an end view of the connector area 84 and coaxial connector assembly 86 of the second embodiment of the card 82 of the present invention as shown in FIG. 8. Connector area 84 includes a dual row 68 pin in-line connector 94. Coaxial connector assembly 86 is positioned longitudinally above connector area 84. Two coaxial connectors 96 are positioned within coaxial connector assembly 86 of card 82. The coaxial connectors 96 have a small physical size, which permit the coaxial connectors to achieve an upper frequency bandwidth of 6.0 GHz. The entire connector interface is low cost, which includes the connector area 84, the dual row 68 pin in-line connector 94, the coaxial connector assembly 86, and the coaxial connectors 96. Thickness 81 represents the total 10.5 mm thickness of card 82. Thickness 93 is 2.2 mm, which represents the thickness of coaxial connector assembly 86. Given that the coaxial connector assembly 86 is within thickness 93, the mating cage connector 46 for coaxial connector assembly 86 can be positioned so that the cage connector 46 do not interfere with PCMCIA Type III cards that do not incorporate the coaxial connectors 96. Thus, card cage assembly 42 of the present invention, which accepts the card 82, can also accept PCMCIA Type III cards. It follows that PCMCIA Type II card 62 and card 44 of FIG. 7 can also be plugged to the cage connector 46 of the card cage assembly 42. Thus, the card cage assembly 42 of FIG. 4 is compatible with a PCMCLA Type III cage assembly. The addition of coaxial connectors permit designers and manufacturers of PCMCIA cards to design a compact, easy to use, blind mateable module for access to wireless technologies that conforms with the PCMCIA specifications.

Figure 10:
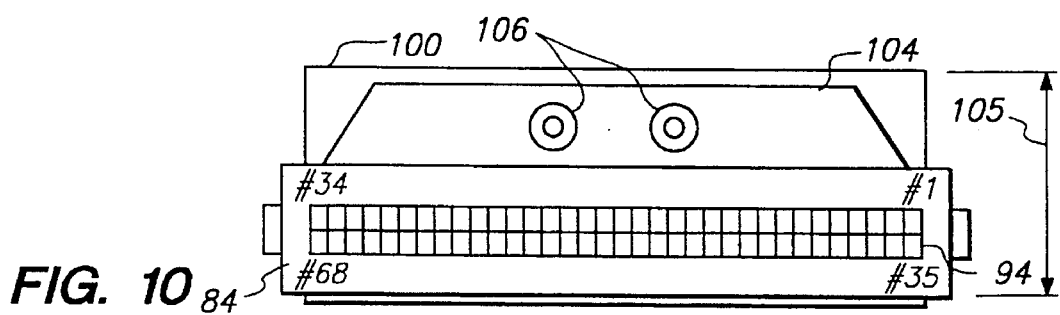
FIG. 10 depicts an end view of a third embodiment of the plug-in card modified according to the present invention.

FIG. 10 is an end view of a third embodiment of a connector interface to the card 82 of FIG. 8 for implementing a coaxial interface. The card 100 of FIG. 10 has a thickness 105. Thickness 105 is 10.5 mm. Connector area 84 includes a dual row 68 pin in-line connector 94. Positioned longitudinally above connector area 84 is coaxial connector assembly 104. Two coaxial connectors 106 are mounted within the coaxial connector assembly 104. The coaxial connectors 106 are larger than the coaxial connectors 96 of FIG. 9 and are placed above the connector area 84 as shown in FIG. 10. The entire coaxial connector assembly 104 including the coaxial connectors 106 are low cost and can be integrated with the connector area 84 containing the dual row 68 pin in-line connector 94. Given that a PCMCIA Type III slot has only one dual row 68 pin in-line connector, the coaxial connector assembly 104 is positioned in the area where the second dual row 68 pin in-line connector would reside in the card cage assembly 42. Those skilled in the art will realize how to remove the second digital connector 128 and position the coaxial connector assembly 104 in the position of the second digital connector 128 of FIG. 4 and FIG. 12 to provide a cage that would mate with the third embodiment of the card 100. The FIG. 10 embodiment of card 100 uses a card cage assembly 42 that has one dual row 68 pin in-line connector. The one dual row 68 pin in-line connector interfaces to one PCMCIA Type III card. Thus, the card 100 of FIG. 10 can incorporate the coaxial connector assembly 104 in the area above the dual row 68 pin in-line connector 94. Coaxial connector assembly 104 provides an implementation for a coaxial interface that utilize a single dual row 68 pin in-line connector.

Figure 11:
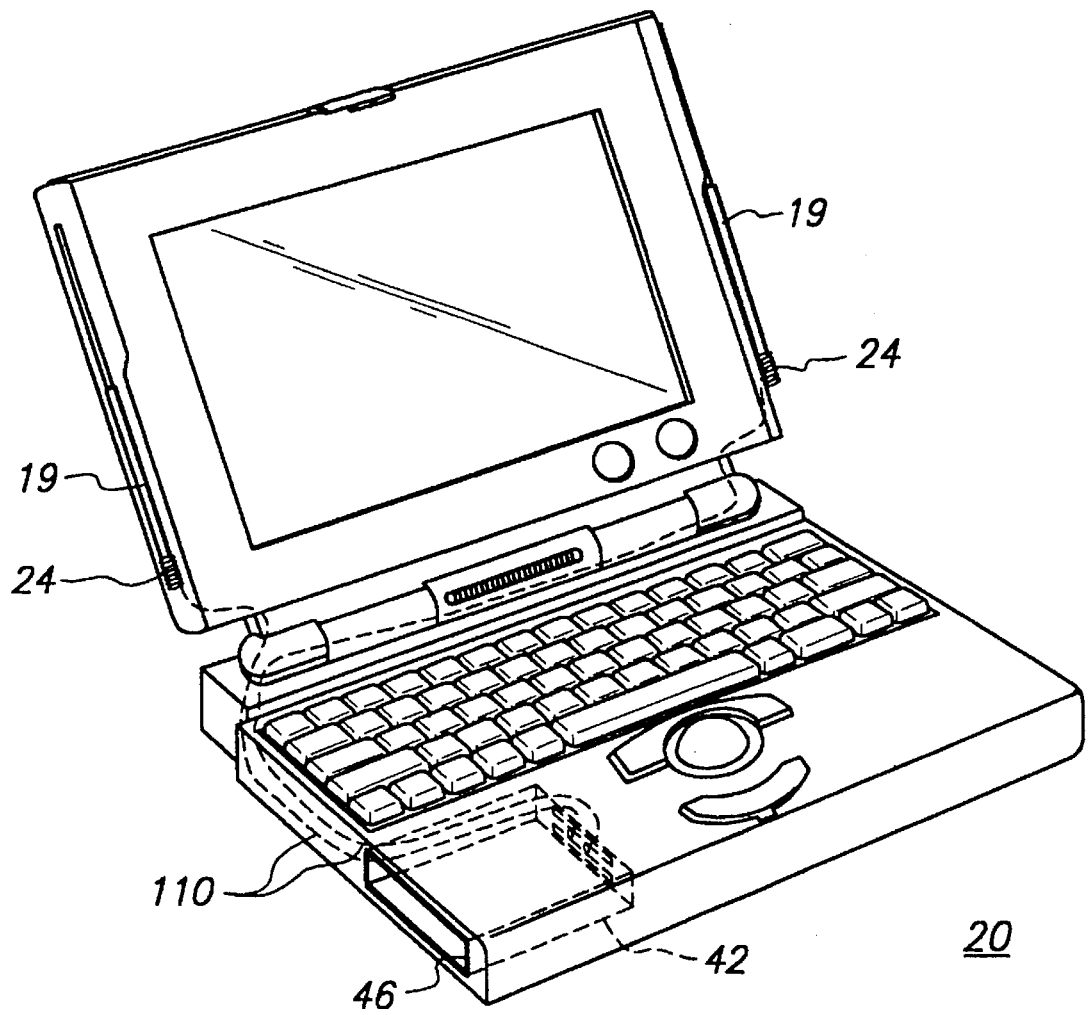
FIG. 11 depicts an example of an application of the connector system of the present invention to a portable computer.

FIG. 11 shows an embodiment of an application of the present invention to a portable computer 20. Portable computer 20 has a card cage assembly 42 of FIG. 4 for accepting the cards 62, 44, and 82. Antennae 19 are embedded in the display area of portable computer 20. Antennae 19 may be telescoping so that the user can extend the antennae 19 for better range. Antennae 19 may also be spring loaded so that springs 24 extend the antennae 19. Coaxial connectors of cage connector 46 of the card cage assembly 42 are internally coupled to the antennae 19 as represented by the dotted lines 110. Referring to PCMCIA Type II card 62 and card 44 of FIGS. 6 and 7, connector area 68 and the coaxial connectors 76 of coaxial connector assembly 69 of card 44 couple to the cage connector 46 of portable computer 20. Card 44 includes transceiver circuitry to access wireless technology using the antennae 19 of the portable computer 20. A PCMCIA Type II card 62 can be inserted in card cage assembly 42 above the card 44.

Wireless communications like paging, cellular voice/data or wireless local area networks (LAN)/wide area networks (WAN) can be supported by embedding the transceiver components in a card 44 that utilizes the coaxial connector assembly 69 to interface to an antenna within the chassis of the computer 20. The coaxial connector assembly 69 provides the radio frequency (RF) interface between the antennae 19 and the transceiver components in the card 44. The portability value of portable computers is greatly enhanced by the integration of coaxial connectors within such a PCMCIA Type II interface.

Embedding antennae 19 in the display of portable computer 20 provides good separation between the antennae. Broad band antennae can be incorporated in portable computer 20 which would enable the portable computer 20 to cover a wide range of frequencies. Antennae changes are not needed to access a wide range of wireless technologies. Users of portable computer 20 can just insert different PCMCIA Type cards for accessing different wireless applications such as paging, cellular or wireless LAN and WAN communications.

While the present invention has been particularly described with reference to FIGS. 1–11, and with emphasis on integrated circuits, it should be understood that the Figures are for illustrative purposes and should not be taken as limitations on the invention. In addition, it is clear that the apparatus of the present invention have utility in many applications where specialized interfacing between electronic components are desired. It is contemplated that many changes and modifications may be made by one of ordinary skilled in the art without departing from the spirit and scope of the invention as disclosed.

What is claimed is:

1. A portable computer system comprising:

an internal connector which provides a first connector for digital signals, a second connector for digital signals, and a third connector for radio frequency (RF) signals;

a first card having devices which support RF operations;

a card connector attached to a first end of the first card, the card connector coupled to devices on the first card, the card connector providing a fourth connector for digital signals and a fifth connector for radio frequency signals; and a cage assembly affixing at one end of the cage assembly the first connector and the second connector with the third connector positioned between the first connector and the second connector so that the first connector and the second connector can be used independent of the third connector, the cage assembly defining slotted guides adapted to receive a plurality of cards such that the third connector may be used alternatively with the first card positioned to mate with the first connector or a second card positioned to mate with the second connector.

2. The system of claim 1, wherein the third connector is a coaxial connector and the first connector and the second connector are digital connectors.

3. The system of claim 2, wherein the third and fifth connectors have a bandwidth from 0 Hz to 6 GHz.

4. The system of claim 2, wherein the fifth connector is a coaxial connector and the fourth connector is a digital connector, the fifth connector and the fourth connector are mateable with the third connector and the first connector, respectively.

5. The system of claim 3, wherein the third connector includes a pair of coaxial connectors.

6. The system of claim 3, wherein the first connector, the second connector, and the fourth connector have an equal number of pins.

7. The system of claim 5, wherein the first card has a generally rectangular shape with an area of increased thickness proximate the first end for housing the fifth connector in a position above the fourth connector.

8. The system of claim 7, wherein the area of increased thickness of the card is sized such that it does not interfere with use of the second connector of the internal connector when the card connector is coupled to the internal connector.

9. The system of claim 7, wherein the cage assembly is capable of holding the first card and the second card simultaneously.

10. A connecting device comprising:

a first connector;

a coaxial connector;

a second connector; and a cage assembly affixing at one end of the cage assembly the first connector and the second connector with the coaxial connector positioned between the first connector and the second connector so that the first connector and the second connector can be used independent of the coaxial connector, the cage assembly defining slotted guides adapted to receive a plurality of cards such that the coaxial connector may be used alternatively with a first card positioned to mate with the first connector or a second card positioned to mate with the second connector.

11. The connecting device of claim 10, wherein the first connector and the second connector are dual row 68 pin in-line connectors.

12. The connecting device of claim 10, wherein the coaxial connector includes a first coaxial connector and a second coaxial connector for transmitting and receiving radio frequency signals.

13. The connecting device of claim 10, wherein the cage assembly defines a plurality of slotted guides for receiving a first module having a mating first connector and a second module having a mating second connector.

14. The connecting device of claim 13, wherein the cage assembly is capable of holding the first module and the second module simultaneously.

15. The connecting device of claim 10, wherein the first connector, the second connector and the coaxial connector are male type connectors.

\* \* \* \* \*

UNITED STATES PATENT AND TRADEMARK OFFICE
CERTIFICATE OF CORRECTION

PATENT NO. : 5,608,606
DATED : March 4, 1997
INVENTOR(S) : Timothy J. Blaney

It is certified that error appears in the above-identified patent and that said Letters Patent is hereby corrected as shown below:

In the claims:

Claim 5, column 10, line 19, "claim 3," should read --claim 4,--
Claim 6, column 10, line 21, "claim 3," should read --claim 4,--
Claim 7, column 10, line 24, "claim 5," should read --claim 6,--

Signed and Sealed this

Twenty-seventh Day of July, 1999

Attest:

Q. TODD DICKINSON

*Attesting Officer*   *Acting Commissioner of Patents and Trademarks*